United States Patent [19]
Ho et al.

[11] Patent Number: 6,156,654
[45] Date of Patent: Dec. 5, 2000

[54] PULSED LASER SALICIDATION FOR FABRICATION OF ULTRA-THIN SILICIDES IN SUB-QUARTER MICRON DEVICES

[75] Inventors: Chaw Sing Ho; Yuan Ping Lee, both of Singapore, Singapore; Chan Lap, San Francisco, Calif.; Yong Feng Lu; R. P.G. Karunasiri, both of Singapore, Singapore

[73] Assignees: Chartered Semiconductor Manufacturing Ltd.; National University of Singapore, both of Singapore, Singapore

[21] Appl. No.: 09/206,746

[22] Filed: Dec. 7, 1998

[51] Int. Cl.[7] .................................................. H01L 21/44
[52] U.S. Cl. ........................ 438/683; 438/664; 438/661; 438/663
[58] Field of Search .................... 438/682, 683, 438/655, 656, 664, 662

[56] References Cited

U.S. PATENT DOCUMENTS

| | | | |
|---|---|---|---|
| 4,555,301 | 11/1985 | Gibson et al. | 437/174 |
| 5,236,865 | 8/1993 | Sandhu et al. | 437/174 |
| 5,593,924 | 1/1997 | Apte et al. | 437/200 |
| 5,601,656 | 2/1997 | Li | 134/2 |
| 5,665,646 | 9/1997 | Kitano | 438/592 |
| 5,741,725 | 4/1998 | Inoue et al. | 437/200 |
| 5,937,325 | 8/1999 | Ishida | 438/655 |

OTHER PUBLICATIONS

S. Wolf, Silicon Processing for the VLSI Era, vol. 2: Process Integration, Lattice Press: Sunset Beach CA, pp. 154–160, 1990.

Primary Examiner—Charles Bowers
Assistant Examiner—Erik Kielin
Attorney, Agent, or Firm—George O. Saile; Rosemary L.S. Pike

[57] ABSTRACT

Methods are disclosed for forming ultra-thin (~300-Å), uniform and stoichiometric C54-titanium silicide with a Ti film thickness of 200–300 Å using pulsed laser salicidation. The invention achieves this by preferably step-scanning from die to die, across the wafer using laser pulses with an optical fluence (laser energy) ranging from 0.1 to 0.2 J/cm$^2$ for approximately 23 nanoseconds per pulse. The source of radiation can be a XeCl or KrF excimer laser, or one in which the laser's wavelength is chosen such that the laser energy is absorbed the most by the refractory metal, i.e. titanium (Ti), cobalt (Co) or nickel (Ni). The laser beam size is typically die-size or can be fine tuned to 1 to 100 $\mu$m and can be optimized to reduce the intensity variation across the laser spot diameter. At each position between 1 to 100 pulses can be emitted on the wafer. Localized heating is possible with the ability to establish the ambient temperature at or below 200° C.

32 Claims, 11 Drawing Sheets

PULSED LASER SALICIDATION FOR FABRICATION OF ULTRA-THIN SILICIDES IN SUB-QUARTER MICRON DEVICES

BACKGROUND OF THE INVENTION

1. Field of the Invention

The invention relates to methods of device fabrication on a silicon substrate, and more particularly to the fabrication of ultra-thin suicides in sub-quarter micron devices through pulsed-laser, self-aligned silicide formation.

2. Description of the Related Art

Current practice uses rapid thermal processing (RTP) for the 2-step anneal in the Ti-Salicide process where "salicide" stands for self-aligned silicide. The term "salicide" is defined by S. Wolf and R. N. Tauber in *Silicon Processing for the VLSI Era*, Volume 1, by Lattice Press, copyright 1986, page 398 as the technology where " . . . metal is deposited over an MOS structure, and reacted with the exposed Si areas of the source and drain, as well as the exposed poly-Si areas on the gate, to form a silicide." With decreasing thermal budget due to bridging and agglomeration considerations, obtaining the low-resistivity C54-phase becomes extremely difficult. The thinner sputtered titanium (Ti) films further reduce the process window for the C49-to-C54phase transformation. In addition, thickness uniformity is another major issue, especially with wafer sizes set to approach the 300 mm generation within the next decade. New methods, materials and schemes are thus needed to extend the integration of the Ti-Salicide process to future generations of sub-quarter micron devices.

U.S. Pat. No. 5,094,977 (Yu et al.) teaches a method comprising a) chemical vapor depositing (CVD) a metal layer atop a semiconductor substrate, and b) impinging laser energy upon the CVD metal layer at an optical fluence from 50 mJ/cm$^2$ to 300 mJ/cm$^2$ for a period of time sufficient to relieve mechanical stress associated with the CVD metal layer, yet insufficient to melt the CVD metal layer. In another aspect, such a treatment method could also be used to form a desired silicide layer in the same step.

U.S. Pat. No. 5,569,624 (Weiner) discloses a doping sequence that forms source/drain regions. The process combines the use of patterned excimer laser annealing, dopant-saturated spin-on glass, silicide contact structures and interference effects created by thin dielectric layers to produce source and drain junctions that are ultra-shallow in depth but exhibit low sheet and contact resistance.

U.S. Pat. No. 4,555,301 (Gibson et al.) shows a method for forming heterostructures comprising multiconstituent epitaxial material, on a substrate comprising formation of a layer of "precursor" material on the substrate, and momentarily melting the precursor material by pulsed irradiation.

U.S. Pat. No. 4,359,486 (Patalong et al.) describes scanning a region of a semiconductor surface intended for a metal contact with a closely packed sequence of intense laser light pulses so as to generate a disturbed surface layer and a metal layer is then applied and alloyed into the semiconductor surface.

SUMMARY OF THE INVENTION

It is an object of the present invention to provide methods to improve the thickness-uniformity across a semiconductor wafer and to ensure localized heating on the metal, which enhances the initial silicidation reaction during the react anneal and leads to greater reaction efficiency between Ti and Si.

Another object of the present invention is to improve the process margin for the C54-TiSi$_2$ formation with a reduction of the thermal budget, as compared to rapid thermal processing (RTP).

Yet another object of the present invention is to overcome the difficulty of the presently practiced 2-step rapid thermal anneal (RTA) process of forming ultra-thin (~300 Å), uniform and stoichiometric C54-TiSi$_2$ with a film thickness of 200–300 Å.

A further object of the present invention is to use it in conjunction with the conventional RTP scheme to improve the Ti-Salicide process.

A yet further object of the present invention is to extend the proposed method of salicidation to form CoSi$_2$, NiSi or NiSi$_2$ for application to the 0.1 μm generation devices.

These objects have been achieved by scanning, preferably step-scanning from die to die, across the wafer using laser pulses with an optical fluence (laser energy) ranging from 0.1 to 0.2 J/cm$^2$ for approximately 23 nanoseconds per pulse. The source of radiation can be a XeCl or KrF excimer laser, or one in which the laser's wavelength is chosen such that the laser energy is absorbed the most by the refractory metal, i.e. titanium (Ti), cobalt (Co) or nickel (Ni). The laser beam size is typically die-size or can be fine-tuned to 1 to 100 μm and can be optimized to reduce the intensity variation across the laser spot diameter. At each position, between 1 to 100 pulses can be emitted on the wafer. Localized heating is possible with the ability to establish the ambient temperature at or below 200° C.

DESCRIPTION OF THE PREFERRED EMBODIMENT

Figure 1:
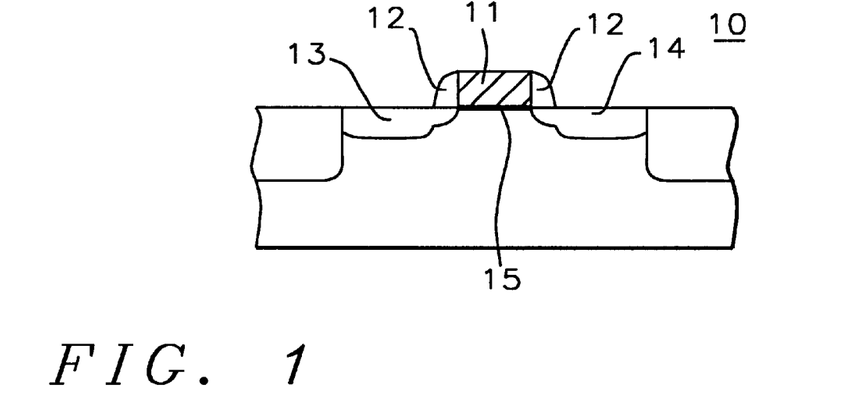
FIG. 1 shows a cross-section of a typical MOSFET structure with polysilicon gate electrodes with sidewall spacers, and source/drain active junctions defined.

Referring now to FIG. 1, we show a typical metal oxide semiconductor field effect transistor (MOSFET) structure 10 with a polysilicon gate electrode 11 with tetraethylorthosilicate (TEOS) glass or silicon nitride ($Si_3N_4$) as sidewall spacers 12, source/drain active junctions 13 and 14 defined and field oxidation 15 in the form of shallow trench isolation (STI).

Figure 2:
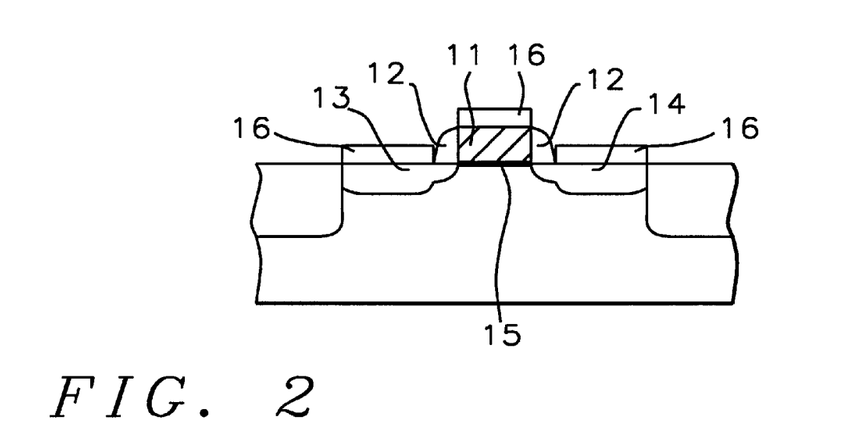
FIG. 2 shows FIG. 1 with selective epitaxial growth (SEG) of silicon (Si) added.

FIG. 2 shows one alternate embodiment, where an extra step is included which involves selective epitaxial growth (SEG) of silicon (Si) 16 of a thickness of 300 to 400 Å prior to salicidation. Subsequent figures (FIGS. 3–4 and FIGS. 8–10) illustrate this particular embodiment. The advantage of this step is that it minimizes the loss of dopants during the silicidation reaction due to Si consumption by the deposited metal i.e. titanium (Ti), cobalt (Co) or nickel (Ni). However, in another embodiment of the invention, this step can be neglected to preserve the simplicity of the fabrication process.

Figure 3:
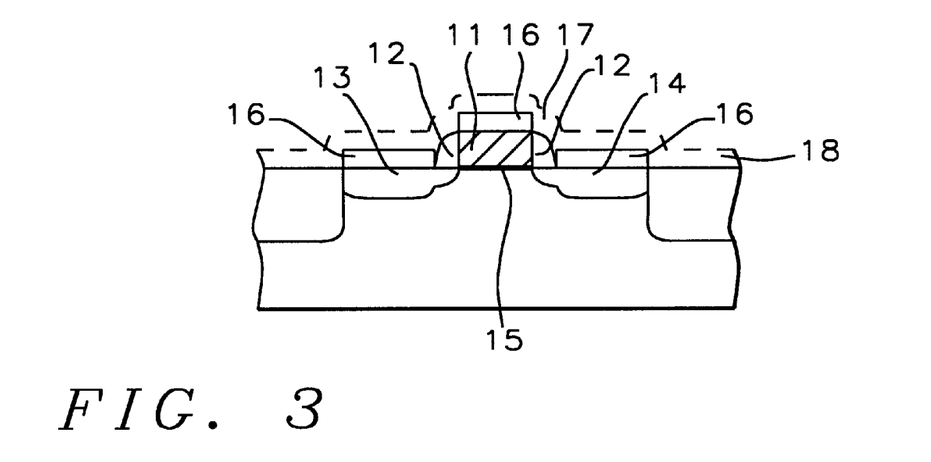
FIG. 3 shows a titanium (Ti) layer followed by a titanium nitride (TiN) cap-layer sputter deposited on top of the SEG of FIG. 2.

After a standard diluted hydrogen fluoride (dHF) clean and/or and in-situ back-sputter clean with argon (Ar), and referring now to FIG. 3, a Ti layer 17 with a thickness ranging from 200 to 300 Å is sputter deposited, followed by a 150 to 200 Å thick titanium nitride (TiN) cap-layer 18. This cap-layer essentially protects the Ti film from contamination, i.e. oxygen from the ambient during the react anneal, and also enhances the phase transformation. The deposition is preferably done within a time window of not more than half a day after the device wafer has been pre-cleaned and passivated with dHF.

Figure 4A:
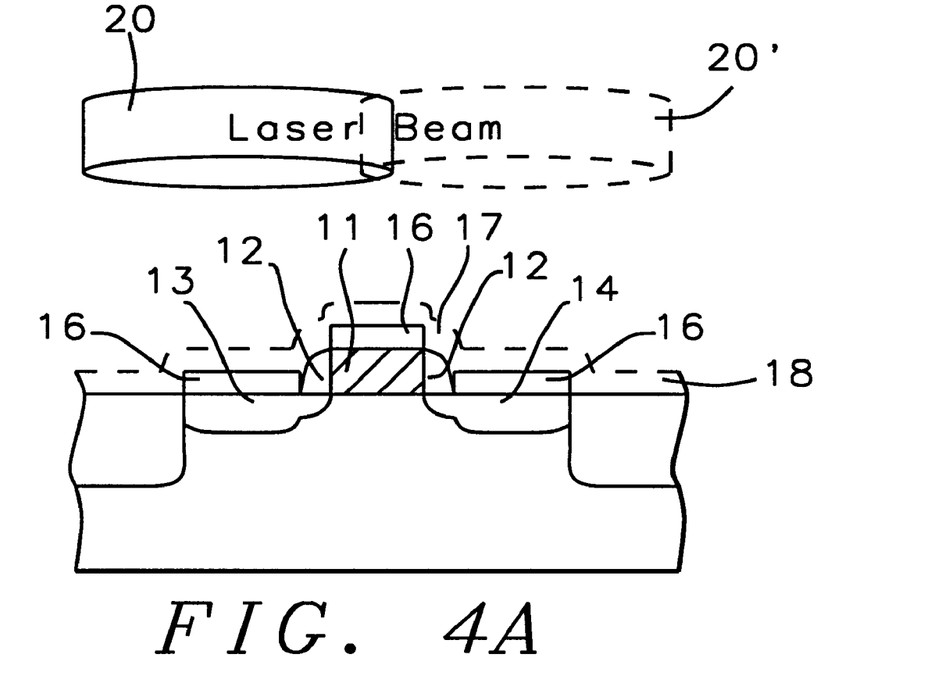
FIG. 4A shows the react anneal through irradiation of the wafer of FIG. 3 by a pulsed laser.

Moving now on to FIG. 4A, the wafer now proceeds to the react anneal. Conventionally, the rapid thermal processing (RTP) conditions for this step are as follows: 690 to 720° C. for 30 to 60 seconds, using a nitrogen ($N_2$) ambient and pressure of 10 to 760 Torr. In the preferred embodiment of the invention, instead of the conventional RTP, a pulsed laser anneal is carried out. The laser source is chosen with a wavelength such that the irradiation will be mostly absorbed by the Ti film 17. FIG. 4A shows a die-sized laser beam 20 impinging on MOSFET structure 10. Laser beam 20 is either die-size or may range in size from 1 to 100 μm. The laser source may either be step-scanned or sweep-scanned across the wafer. The dotted outline 20' of laser beam 20 is intended to show the beam's motion.

Figure 4B:
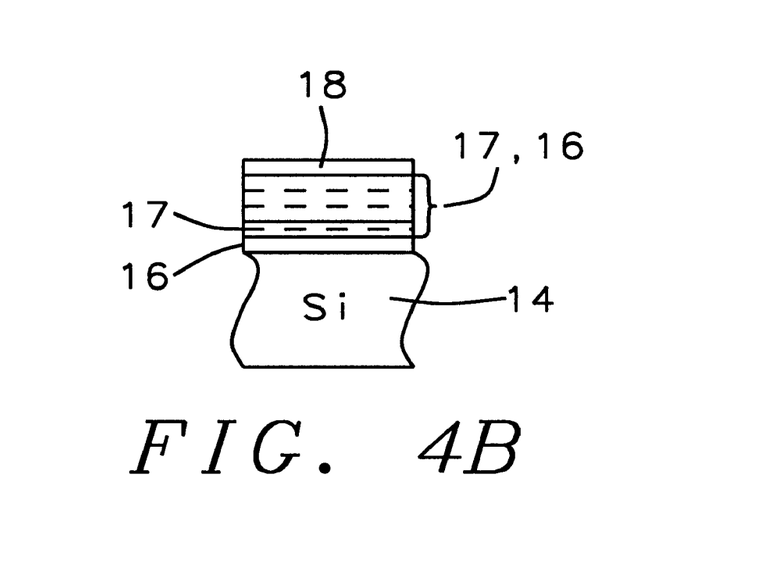
FIG. 4B shows an enlarged cross-section of the source/drain active junction of FIG. 4A.
Figure 7:
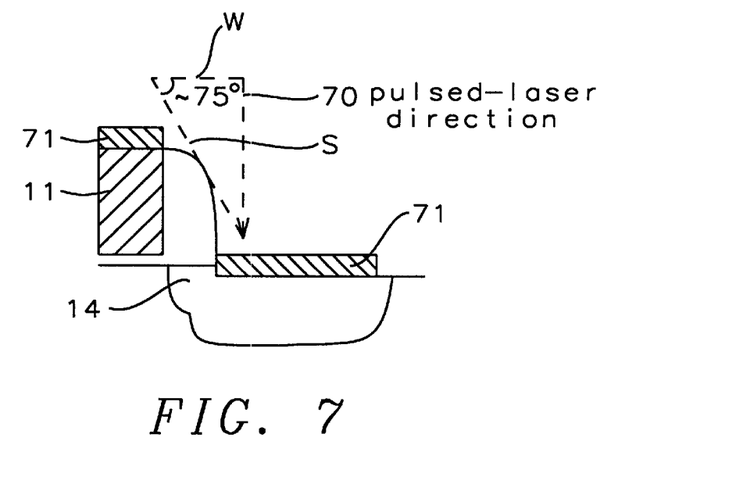
FIG. 7 is an enlarged detail of the cross-section of FIG. 4A demonstrating the effects of the pulsed laser direction upon the sidewall spacer.

FIG. 4B is an enlarged detail of the cross-section of the source/drain junction 14, and illustrates schematically the layering both prior (left side) to and after (right side) irradiation. On the left is shown the TiN layer 18 followed by Ti layer 17 and SEG Si layer 16 atop active junction 14. On the right side is TiN layer 18 atop a layer of heated and intermingled Ti 17/SEG Si 16, followed by unmelted SEG Si 16 atop active junction 14. The intermingled Ti 17/SEG Si 16 will be transformed under the influence of the pulsed laser react anneal to C49-$TiSi_2$ 71, as pointed out in subsequent FIG. 7.

A feasible condition for the pulsed laser anneal (based on an implicit finite difference scheme to solve the heat flow equation in materials for laser irradiation; see simulation results of FIGS. 11 to 16) is using an optical fluence (laser energy) ranging from 0.09 to 0.15 $J/cm^2$, where 0.12 $J/cm^2$ is the optimal point, and with an $N_2$ or Ar ambient at a temperature typically equal to or less than 200° C. and a pressure of 760 Torr or less. The TiN cap-layer 18, which has a melting point higher than Ti (~1800° C.) will not melt under this condition.

A key consideration here is the impact of the laser pulses on the silicon nitride $Si3N_4$ 21 (FIG. 5) or silicon oxide $SiO_2$ 22 (FIGS. 6A and 6B) sidewall spacers, as well as the field oxide 15. These figures are obtained from the following reference: A. E. Morgan, E. K. Broadbent, K. N. Ritz, D. K. Sadana, and B. J. Burrow in "*Interactions of thin Ti films with Si, $SiO_2$, $Si_3N_4$, and $SiO_xN_y$ under rapid thermal annealing*", Journal of Applied Physics 64 (1), pp. 344, 1988. Typically, due to the insulating property of the silicon oxide and silicon nitride (hereafter simply called oxide and nitride, respectively), the interfacial temperature with the metal (Ti) is higher than that in the case of the Ti—Si interface for any given optical fluence. However, due to the quarter-dome profile of the spacers 12 (refer to FIG. 7), the actual irradiated area based on any optical fluence is higher, thus leading to a lower equivalent optical fluence at the spacer regions. The length of segment S tangent to the spacer 12, based on the angle of 75° in this illustrative example, is about 3.9 times longer than segment W (W/cos 75), where W stands for the width of the spacer. This translates to a lower temperature than it would have been had the surface of the oxide or nitride been flat and with the pulsed laser direction 70 at right angle to the surface of the oxide or nitride. However, for process optimization, the laser energy or optical fluence should be chosen such that the metal-oxide/nitride interfacial temperature does not exceed ~720° C. Beyond 750° C. the Ti will reduce the oxide or nitride spacers substantially, with the formation of $Ti_5Si_3$ 23, leading to potential leakage across the spacers if not removed completely during the etchback process or even due to the reduced spacer widths. This will compromise the eventual reliability of the fabricated devices.

Figure 5:
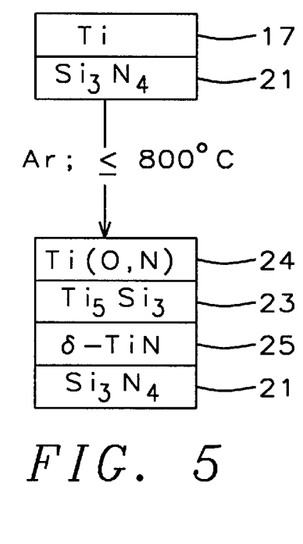
FIG. 5 is a block diagram illustrating the impact of the laser pulses on the nitride sidewall spacers as well as the field oxide.

FIG. 5 shows in detail the conversion of the Ti 17 and $Si_3N_4$ 21 layer in an Ar ambient at a temperature of 800° C. or less to Ti(O,N) 24, $Ti_5Si_3$ 23, δ-TiN 25, and $Si_3N_4$ 21.

Figure 6A:
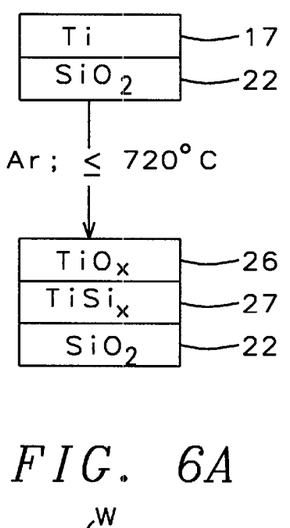
FIG. 6A is a block diagram illustrating the impact of the laser pulses on the oxide sidewall spacers as well as the field oxide, in an argon (Ar) ambient.

FIG. 6A shows in detail the conversion of the Ti 17 and $SiO_2$ 22 layer in an Ar ambient at a temperature of 720° C. or less to $TiO_x$ 26, $TiSi_x$ 27, and $SiO_2$ 22.

Figure 6B:
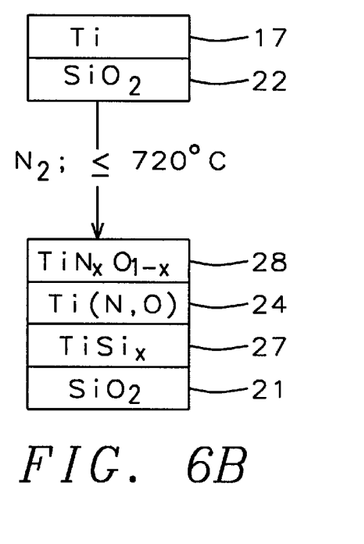
FIG. 6B is a block diagram illustrating the impact of the laser pulses on the oxide sidewall spacers as well as the field oxide, in a nitrogen (N$_2$) ambient.

FIG. 6B shows in detail the conversion of the Ti 17 and $SiO_2$ 22 layer in an $N_2$ ambient at a temperature of 720° C. or less to $TiN_xO_{1-x}$ 28, Ti(N,O) 24, $TiSi_x$ 27, and $SiO_2$ 22.

FIGS. 5, 6A, and 6B essentially illustrate the restriction placed upon the thermal cycle during the first RTA. If spacer 12 is $Si_3N_4$, a higher process margin is permitted in terms of a larger laser fluence ($J/cm^2$). It is important that the interfacial reaction between the metal deposited, i.e. Ti, Co or Ni, and the dielectric spacer or field oxidation region 15 does not result in substantial metal silicide formation. This can present problems during the subsequent salicide etchback (wet etch) to eliminate leakage paths across the spacers and field oxide. Therefore, the laser fluence used during the first RTA to induce silicidation has to be suppressed such that the interfacial temperature does not exceed the values as indicated in FIGS. 5, 6A, and 6B.

Figure 8:
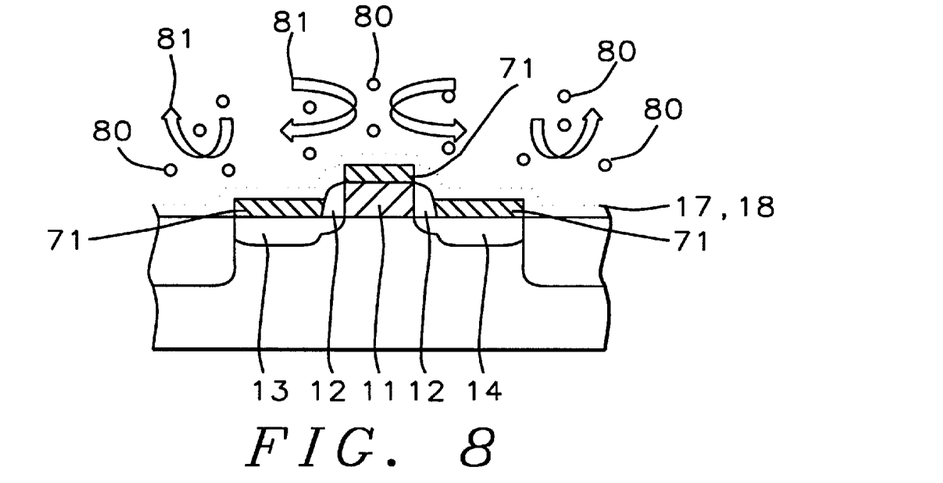
FIG. 8 pictorially shows the action of the wet etch on the MOSFET structure.

A wet etch, as illustrated in FIG. 8, using an ammonium-based peroxide mixture 80 can be used to clean away (shown pictorially by curved arrows 81) the TiN cap-layer 18 and any unreacted metal 17 on the polysilicon 11 and C49-TiSi$_2$ regions 71, which will be minimal because of the enhanced silicidation reaction during the react anneal using the pulsed laser.

A final anneal using RTP can be used to complete this flow. This step is necessary for the completion of the phase conversion and for any cluster defects in the silicide film to be annealed out. Alternatively, and the preferred embodiment of the invention, the pulsed-laser can also be used in this step. Conventional RTP for the final transformation anneal for the C49-to-C54 (high-resistivity to low-resistivity) phase conversion is carried out at ~850° C. for 10 to 30 seconds in N$_2$ ambient. For the pulsed-laser case, the optical fluence which can be used, based on our simulation results, ranges from 0.1 to 0.2 J/cm$^2$ but is optimal at 0.14 J/cm$^2$, which translates to ~850° C. at the C49-TiSi$_2$/Si interface. At this temperature, the ultra-thin TiSi$_2$ film which is formed (300 to 400 Å) will not agglomerate. The final film is expected to be one with fewer defect clusters and reduced interfacial roughness thus leading to minimal risks of silicide asperities spiking through the junction when the device is bias stressed.

Figure 9:
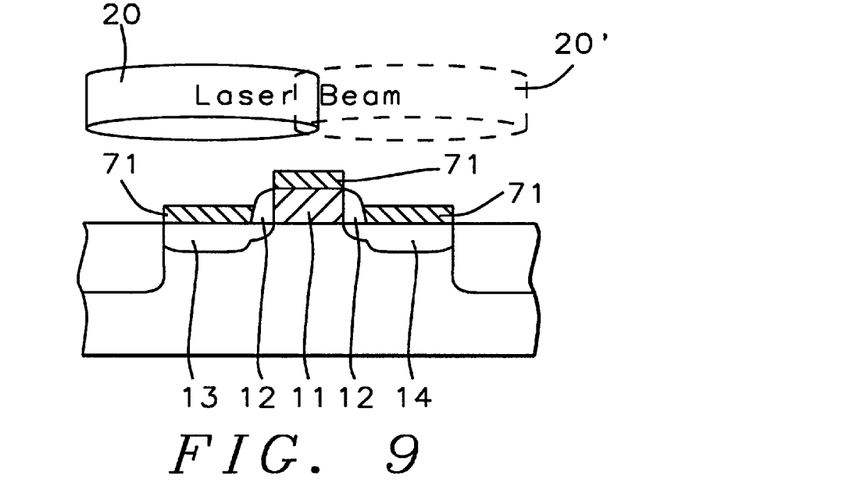
FIG. 9 depicts the final anneal through a second irradiation of the C49-TiSi$_2$ interface by a pulsed laser.
Figure 10:
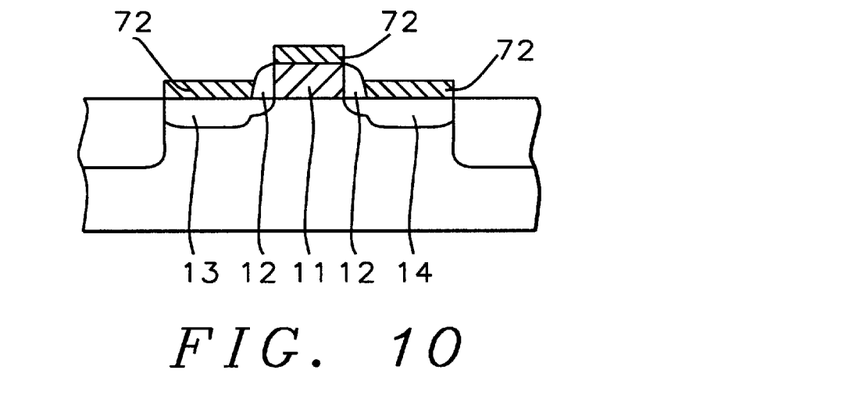
FIG. 10 depicts the C54 TiSi$_2$ film resulting from the C49-to-C54 phase conversion.

FIG. 9 illustrates the final anneal process. A laser beam 20, with characteristics as just described, scans (step-scan or sweep-scan) the MOSFET structure 10, where C49-TiSi$_2$ 71 is on top of the polysilicon gate electrode 11 and source/drain active junctions 13 and 14. The dotted outline 20' of laser beam 20 is intended to show the beam's motion. Laser beam 20 may be either die-size or may range in size from 1 to 100 μm. FIG. 10 depicts the last step of this process showing the transformed C54-TiSi$_2$ layer 72.

Another preferred embodiment of the invention is to sputter deposit either cobalt Co or nickel Ni instead of Ti. The advantages of forming Co- or Ni-silicides are that epitaxial quality silicide can be formed because of their relatively small lattice mismatch with the Si substrate, less dopant segregation compared to TiSi$_2$, and essentially no or little linewidth effect being observed for sheet resistance on doped narrow polysilicon gates.

The process is essentially similar to the one described above, with a TiN cap-layer deposited in-situ with the Co or Ni. The thickness of the Co or Ni is restricted to about 120 to 200 Å and 300 to 350 Å, respectively, because of a higher silicon consumption for Co as compared to Ti. A pulsed laser anneal is used during the react anneal to form silicides of cobalt (CoSi or CoSi$_2$) or silicides of nickel (NiSi or NiSi$_2$) after which a selective wet etch is carried out. A second RTP anneal or a second pulsed laser anneal is then carried out at about 750° C. and 650° C. for the formation of CoSi$_2$ and NiSi, respectively. Advantages include enhanced interfacial uniformity, plus the fact that the silicide thickness variation usually associated with the RTP process across the wafer will be minimized.

Figure 11:
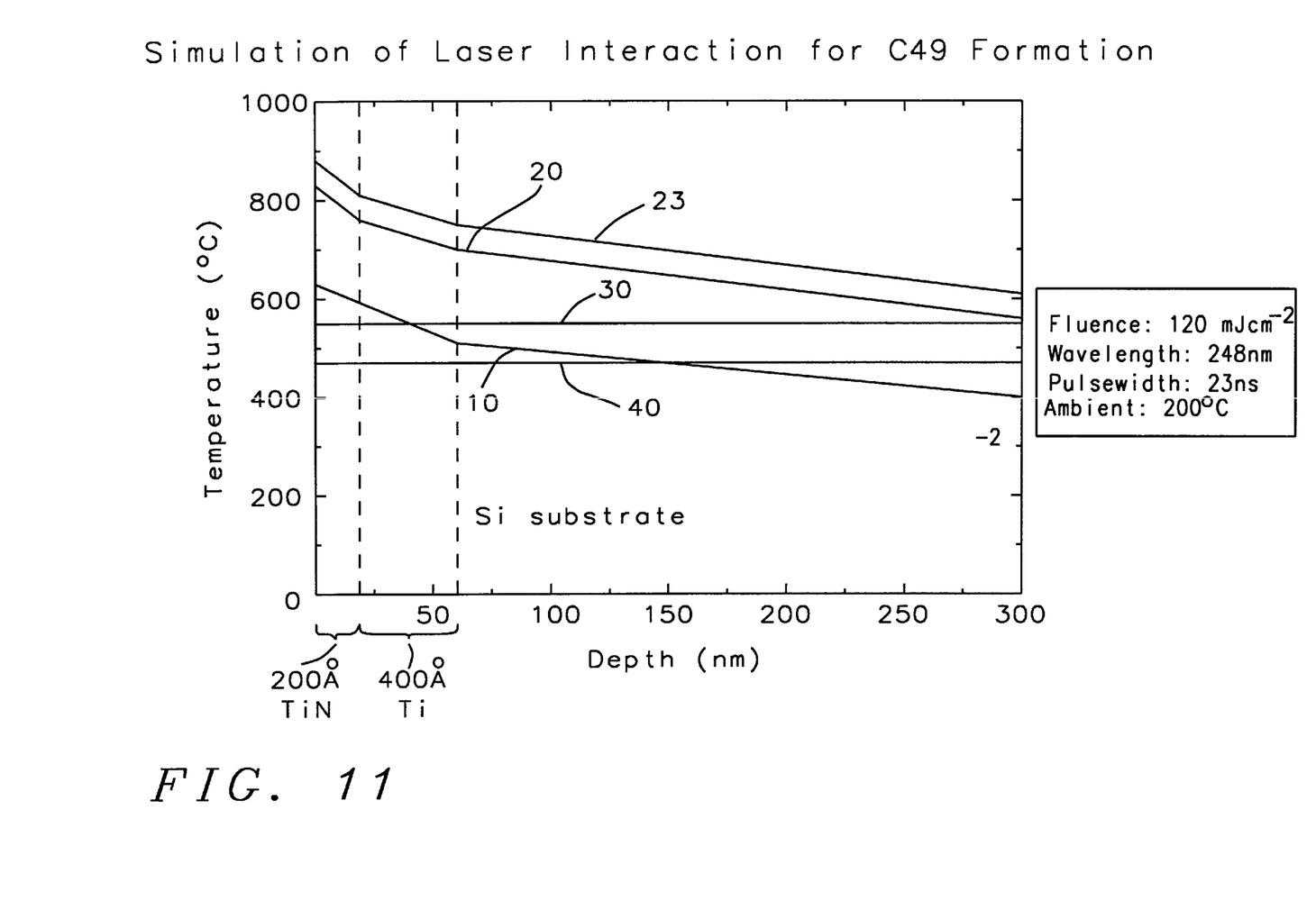
FIGS. 11 to 13 are graphs of a simulation of laser interaction for a TiN thickness of 200 Å and a Ti thickness of 400 Å, for a laser pulse of 23 ns pulsewidth from 10 ns to 40 ns.
Figure 12:
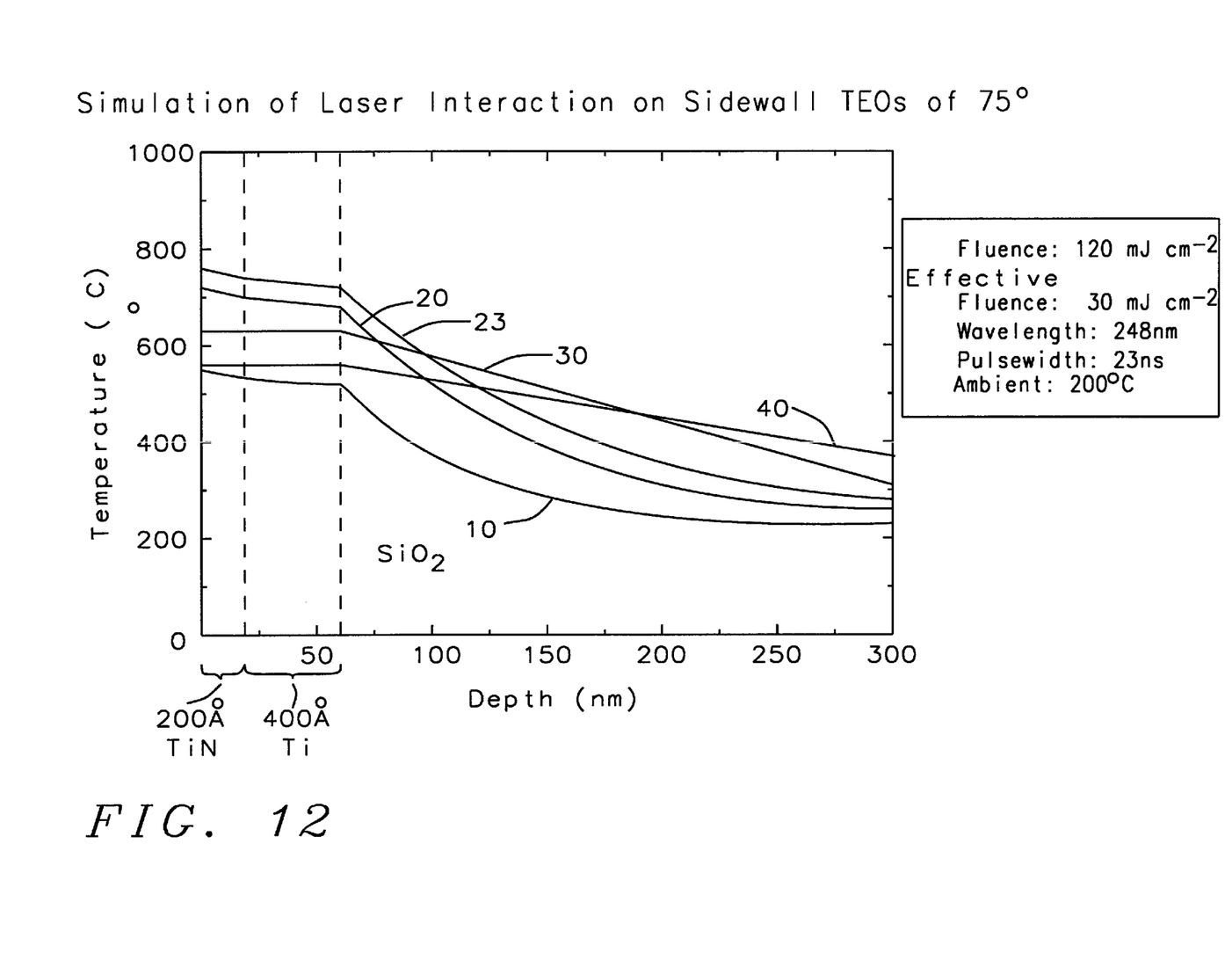
Figure 13:
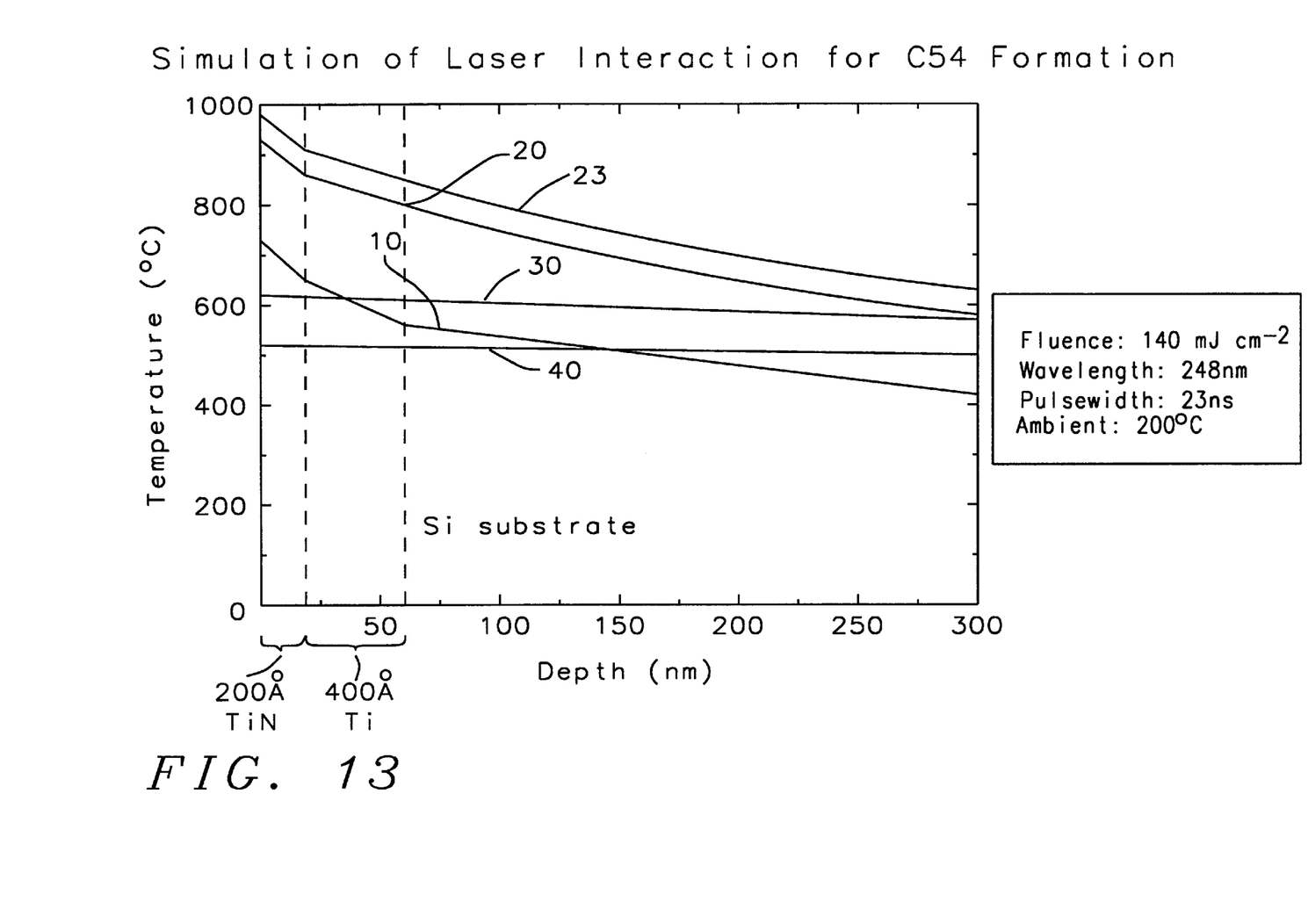
Figure 14:
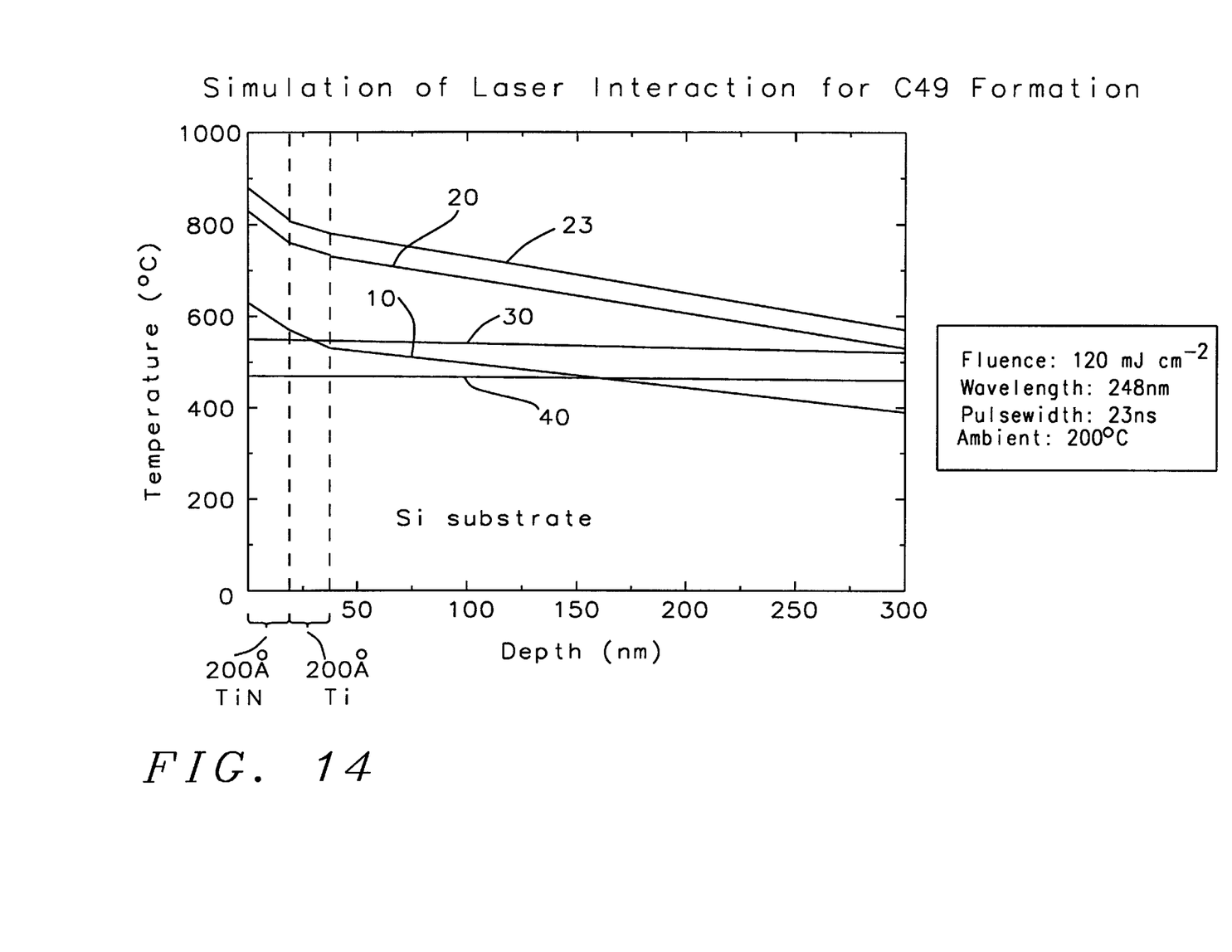
FIGS. 14 to 16 are graphs of a simulation of laser interaction for a TiN thickness of 200 Å and a Ti thickness of 200 Å, for a laser pulse of 23 ns pulsewidth from 10 ns to 40 ns.
Figure 15:
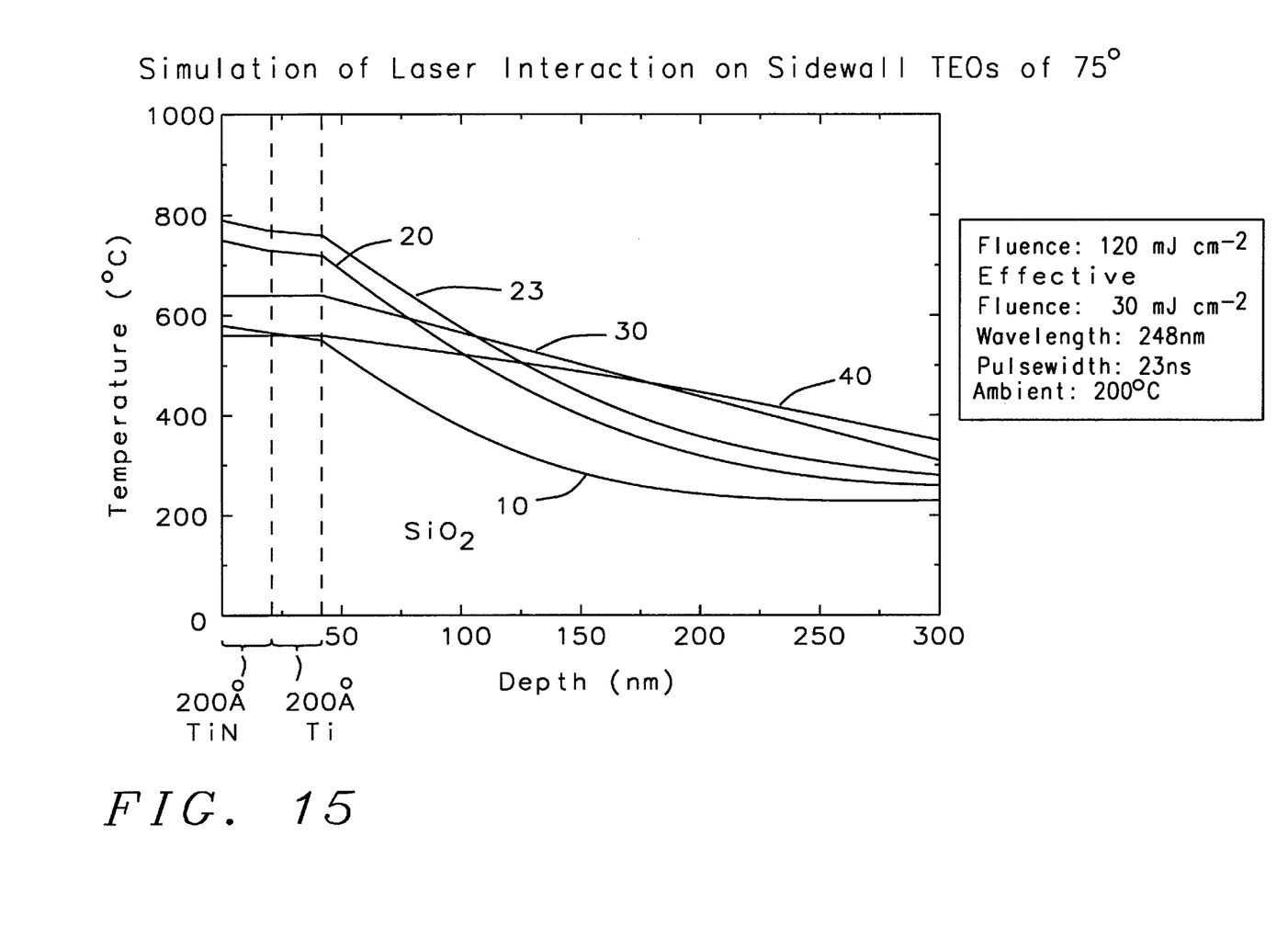
Figure 16:
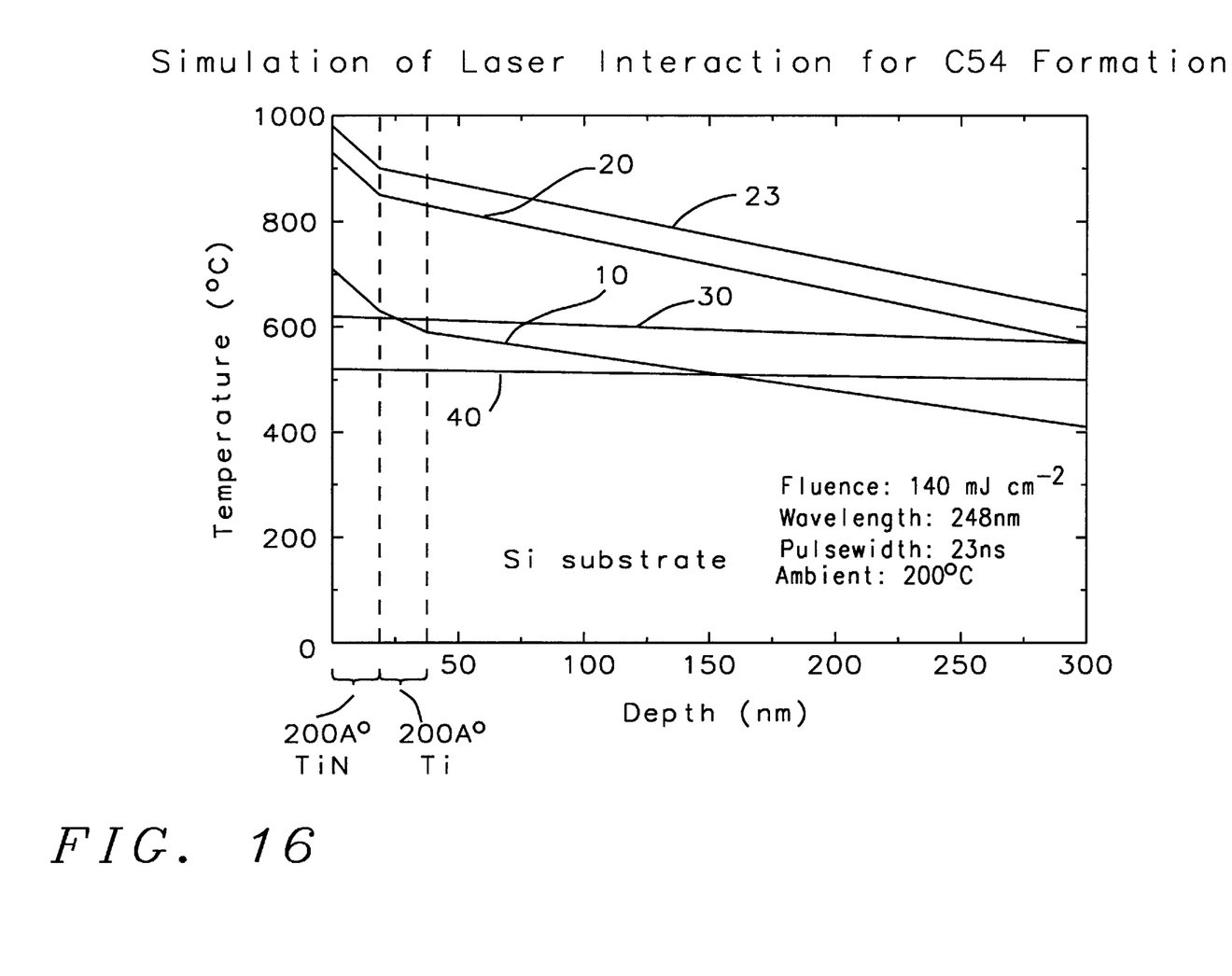

The series of graphs in FIGS. 11 to 16 show some representative simulated results for heat flow with a different base-stack (TiN/Ti/Si or TiN/Ti/SiO$_2$) and different Ti thickness (200 Å or 400 Å). FIGS. 11 to 13 show the simulated heat flow profiles for a 200 Å TiN on 400 Å Ti and FIGS. 14 to 16 show the simulated heat flow profiles for a 200 Å TiN on 200 Å Ti. FIGS. 11 and 14 are titled "Simulation of Laser Interaction For C49 Formation", FIGS. 12 and 15 are titled "Simulation of Laser Interaction on Sidewall TEOs of 75°", and FIGS. 13 and 16 are titled "Simulation of Laser Interaction For C54 Formation".

In FIGS. 11 to 16:

Curve 10 represents the temperature profile at 10 nanoseconds,

Curve 20 represents the temperature profile at 20 ns,

Curve 23 represents the temperature profile at 23 ns,

Curve 30 represents the temperature profile at 30 ns, and

Curve 40 represents the temperature profile at 40 ns.

All Curves when irradiated by a laser pulse of 23 ns pulsewidth.

As mentioned earlier, of key concern was the interfacial temperature at the Ti-SiO$_2$ interface. With a chosen optical fluence of typically 0.12 J/cm$^2$, which may range from 0.09 to 0.15 J/cm$^2$, the effective fluence on the spacers was typically ~0.03 J/cm$^2$, but could range from 0.01 to 0.05 J/cm$^2$. This translates to an interfacial temperature of approximately 720° C., but ranging from 700 to 730° C. At this chosen fluence, the temperature at the Ti-Si interface during the react anneal was similar, which is high enough for the C49-TiSi$_2$ formation. The final transformation anneal uses a fluence of typically 0.14 J/cm$^2$ which increases the Ti-Si interfacial temperature to 850° C., sufficient for the phase conversion. A key point to note is the localized heating by the laser, specifically on the metal film without increasing the ambient temperature to the temperature at which the wafer is annealed. The preferred laser pulse-on is 23 ns, though simulation runs are also shown for 10 ns and 20 ns pulse-on durations. The wavelength used for the simulations is 248 nanometers (nm) throughout; actual wavelengths used depend on a variety of factors such as absorption of the laser energy by the refractory metal (e.g. Ti, Co or Ni) as already discussed.

As observed from FIG. 13, the simulation results show that for a time of 30 ns (which includes a pulse-off period of 7 ns), the temperature in the Si-substrate reduces from 850° C. to 600° C. A further 10 ns pulse-off period (total 40 ns) results in a further temperature drop in the Si-substrate to ~500° C., unlike in RTP. This shows that the chances of dopant re-distribution and segregation are minimized with this method, thus leading to improved contact resistance ranging from 4 to 8 Ω/cont. and ultra-shallow junctions ranging from 500 to 1500 Å, respectively.

FIGS. 14 to 16 illustrate the simulation results for 200 Å Ti using the same conditions as above. Typically, the interfacial temperatures are higher as expected. For thinner Ti films, lowering of the optical fluence may be necessary due to spacer and field oxide considerations.

Key advantages of the present invention of providing methods for the pulsed-laser salicidation include localized heating without having to expose the entire wafer to the temperatures which the react anneal and transformation anneal require, as in the case of conventional RTP furnaces, so that the integrity of the ultra-shallow junction depths are preserved. In addition, the reaction efficiency of the metal and Si is improved during the react anneal, leading to thicker suicides with excellent interface uniformity. The issue regarding non-uniformity across wafers encountered in most RTP systems is also minimized in the methods proposed here. It can be seen that the temperature control is better than in a conventional RTP furnace, since the main parameter used here is the optical fluence. In addition, wafer throughput is also potentially higher because the laser pulse-width is in the nanosecond range.

While the invention has been particularly shown and described with reference to the preferred embodiments thereof, it will be understood by those skilled in the art that various changes in form and details may be made without departing from the spirit and scope of the invention.

Figure 17:
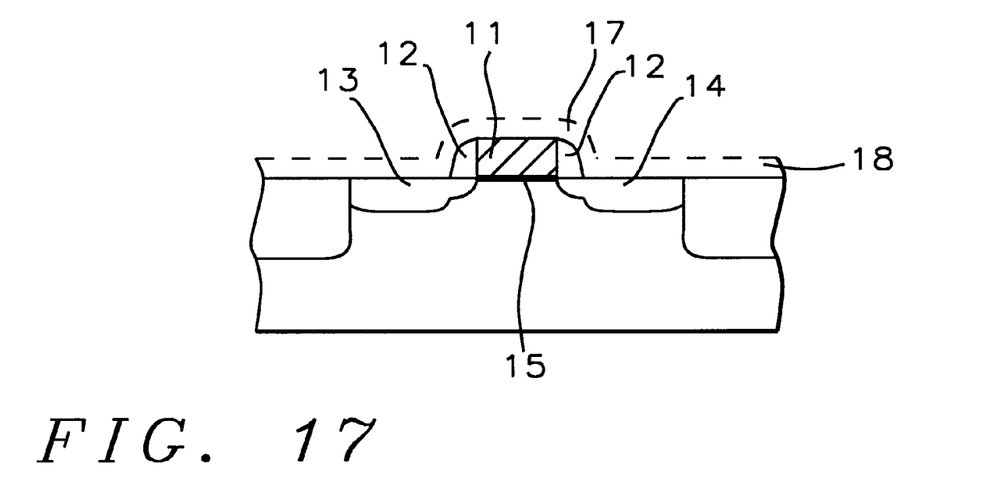
FIG. 17 shows a titanium (Ti) layer followed by a titanium nitride (TiN) cap-layer sputter deposited on top of the structure of FIG. 1.
Figure 18:
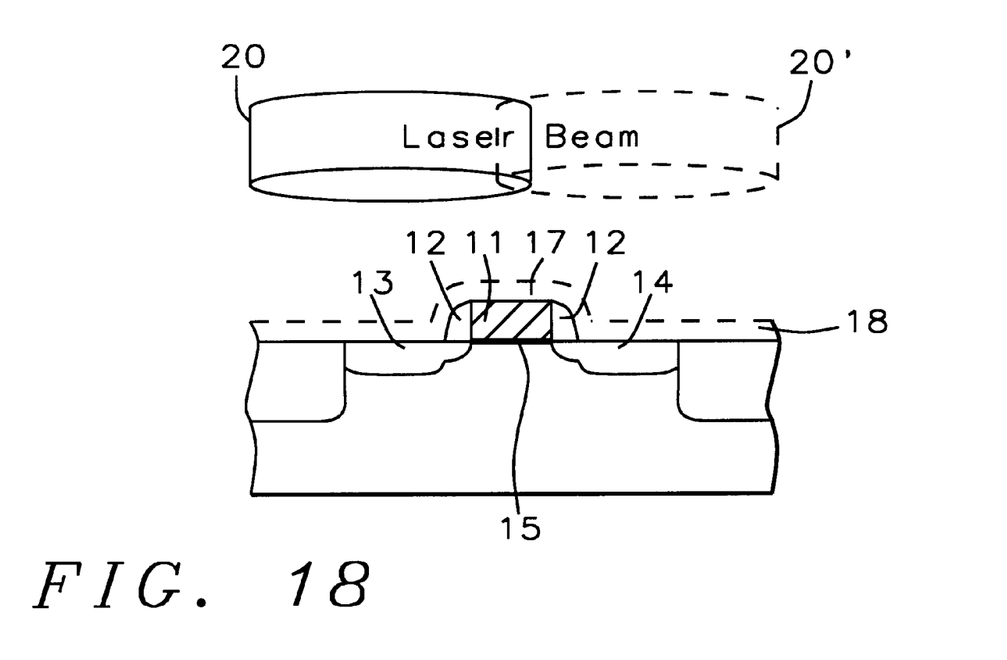
FIG. 18 shows the react anneal through irradiation of the wafer of FIG. 17 by a pulsed laser.

If the alternate embodiment, as depicted in FIG. 2 is not selected the process follows FIG. 17 where like parts are identified by like numerals. After a standard diluted hydrogen fluoride (dHF) clean and/or and in-situ back-sputter clean with argon (Ar) a Ti layer 17 with a thickness ranging from 200 to 300 Å is sputter deposited, followed by a 150 to 200 Å thick titanium nitride (TiN) cap-layer 18. This cap-layer essentially protects the Ti film from contamination, i.e. oxygen from the ambient during the react anneal, and also enhances the phase transformation. The deposition is preferably done within a time window of not more than half a day after the device wafer has been pre-cleaned and passivated with dHF. The wafer now proceeds to the react anneal as depicted in FIG. 18. This step is identical to the one described for FIG. 4A. As a result of the laser react anneal there will be TiN layer 18 atop a layer of heated and intermingled Ti 17/junction (13 or 14), followed by the unmelted active junction. The intermingled Ti 17/junction will be transformed under the influence of the pulsed laser react anneal to C49-TiSi$_2$ (not shown).

What is claimed is:

1. A method of pulsed laser salicidation for the fabrication of ultra-thin suicides on a silicon substrate, comprising the steps of:

providing metal-oxide semiconductor field-effect structures on a silicon wafer each with a polysilicon gate electrode with tetraethyl orthosilicate (TEOS) glass or silicon nitride as sidewall spacers, source/drain active junctions defined and field oxidation in the form of shallow trench isolation (STI);

providing selective epitaxial growth (SEG) of silicon ranging in thickness from 300 to 400 Å on said gate electrode and said source/drain;

cleaning said wafer with diluted HF or in-situ back-sputter with argon;

sputter depositing a titanium (Ti) layer to a thickness ranging from 200 to 300 Å on top of said wafer;

sputter depositing a titanium-nitride (TiN) cap-layer with a thickness ranging from 150 to 200 Å on top of said Ti layer;

forming a phase C49 silicide by providing a react anneal of said Ti layer with a pulsed laser, the wavelength of said pulsed laser chosen such that the irradiation will be mostly absorbed by said Ti layer, the optical fluence, or laser energy, of said pulsed laser ranging from 0.09 to 0.15 J/cm$^2$ and having a pulse duration ranging from 15 to 30 nanoseconds;

wet etching said wafer to clean away said TiN cap layer and any unreacted Ti layer from said polysilicon gate electrodes and said silicon source/drain active junctions; and providing a final anneal using a pulsed laser with an optical fluence ranging from 0.1 to 0.2 J/cm$^2$ to convert said Ti layer from said phase C49 silicide into stoichiometric phase C54 titanium silicide (TiSi$_2$) ranging in thickness from 300 to 400 Å.

2. The method of claim 1, wherein said react anneal is carried out at an ambient temperature equal to or less than 200° C., in an ambient of nitrogen (N$_2$) or argon (Ar) at a pressure equal to or less than 760 Torr.

3. The method of claim 1, wherein the wavelength of said pulsed laser is that of an XeCl or KrF excimer laser.

4. The method of claim 1, wherein said sidewall spacers are comprised of silicon oxide (SiO$_2$).

5. The method of claim 1, wherein said optical fluence of said pulsed laser of said react anneal impinging on said sidewall spacers does not produce a temperature exceeding 720° C. in said Si$_3$N$_4$ or SiO$_2$ of said sidewall spacers.

6. The method of claim 1, wherein said final pulsed laser anneal translates to a temperature of approximately 850° C. at a C49-TiSi$_2$/Si interface.

7. The method of claim 1, wherein said TiSi$_2$ when formed at 850° C. will not agglomerate.

8. The method of claim 1, wherein said TiSi$_2$ layer, after said final anneal, has a contact resistance ranging from 4 to 8 Ω/cont.

9. The method of claim 1, wherein said source/drain active junctions, after said final anneal, have a thickness ranging from 500 to 1500 Å.

10. The method of claim 1, wherein the step of providing SEG of silicon on said gate electrode and said source/drain is omitted.

11. A method of pulsed laser salicidation for the fabrication of ultra-thin suicides on a silicon substrate, comprising the steps of:

providing metal-oxide semiconductor field-effect structures on a silicon wafer each with a polysilicon gate electrode with tetraethyl orthosilicate (TEOS) glass or silicon nitride sidewall spacers, source/drain active junctions defined and field oxidation in the form of shallow trench isolation (STI);

providing selective epitaxial growth (SEG) of silicon ranging in thickness from 300 to 400 Å on said gate electrode and said source/drain active junctions;

cleaning said wafer with diluted HF or in-situ back-sputter with argon;

sputter depositing a metal layer selected from the group consisting of Co and Ni with a thickness restricted to a range from 120 to 200 Å and 300 to 350 Å, respectively, on top of said wafer;

sputter depositing a titanium-nitride (TiN) cap-layer with a thickness ranging from 150 to 200 Å on top of said metal layer;

forming a phase C49 silicide by providing a react anneal of said metal layer with a pulsed laser, the wavelength of said pulsed laser chosen such that the irradiation will be mostly absorbed by said metal layer, the optical fluence, or laser energy, of said pulsed laser ranging from 0.09 to 0.15 J/cm$^2$ and having a pulse duration ranging from 15 to 30 nanoseconds;

wet etching said wafer to clean away said TiN cap layer and any unreacted metal layer from said polysilicon gate electrodes and silicon source/drain active junctions; and providing a final anneal using a pulsed laser with an optical fluence ranging from 0.1 to 0.2 J/cm$^2$ to convert said metal layer selected from the group consisting of Co or Ni from said phase C49 suicide into stoichiometric phase C54 cobalt silicides (CoSi, CoSi$_2$) or a stoichiometric phase C54 nickel silicide (NiSi), respectively, ranging in thickness from 300 to 400 Å.

12. The method of claim 11, wherein said react anneal is carried out at an ambient temperature equal to or less than 200° C., in an ambient of nitrogen (N$_2$) or argon (Ar) at a pressure equal to or less than 760 Torr.

13. The method of claim 11, wherein the wavelength of said pulsed laser is that of an XeCl or KrF excimer laser.

14. The method of claim 11, wherein said cobalt silicides when formed at approximately 750° C. or nickel suicides when formed at approximately 650° C. will not agglomerate.

15. The method of claim 11, wherein said sidewall spacers are comprised of silicon oxide (SiO$_2$).

16. The method of claim 11, wherein said final pulsed laser anneal translates to a temperature of approximately 750° C. for the formation of cobalt silicides or 650° C. for the formation of nickel silicides, at a cobalt silicide/Si interface or nickel silicide/Si interface.

17. The method of claim 11, wherein said optical fluence of said pulsed laser of said react anneal impinging on said sidewall spacers does not produce a temperature exceeding 720° C. in said $Si_3N_4$ or $SiO_2$ of said sidewall spacers.

18. The method of claim 11, wherein said cobalt silicide layer or nickel silicide layer, after said final anneal, has a contact resistance ranging from 4 to 8 $\Omega$/cont.

19. The method of claim 11, wherein said source/drain active junctions, after said final anneal, have a thickness ranging from 500 to 1500 Å.

20. The method claim 11, wherein the step of providing SEG of silicon on said gate electrode and said source/drain is omitted.

21. The method of claim 11, wherein said cobalt silicide or nickel silicides offer the advantage of a small lattice mismatch with said silicon substrate.

22. The method of claim 11, wherein said cobalt silicide or nickel silicides offer the advantage of less dopant segregation compared to $TiSi_2$.

23. The method of claim 11, wherein said cobalt silicide or nickel suicides observe essentially no or little linewidth effect for sheet resistance on doped narrow polysilicon gates.

24. A method of pulsed laser salicidation for the fabrication of ultra-thin suicides on a silicon substrate, comprising the steps of:

provi­ding metal-oxide semiconductor field-effect structures on a silicon wafer each with a polysilicon gate electrode with tetraethyl orthosilicate (TEOS) glass or silicon nitride sidewall spacers, source/drain active junctions defined and field oxidation in the form of shallow trench isolation (STI);

providing selective epitaxial growth (SEG) of silicon ranging in thickness from 300 to 400 Å on said gate electrode and said source/drain active junctions;

cleaning said wafer with diluted HF or in-situ back-sputter with argon;

sputter depositing a metal layer selected from the group consisting of Ti, Co and Ni with a thickness ranging from 200 to 300 Å, 120 to 200 Å, and 300 to 350 Å, respectively, on top of said wafer;

sputter depositing a titanium-nitride (TiN) cap-layer with a thickness ranging from 150 to 200 Å on top of said metal layer;

forming a high resistivity phase C49 silicide by providing a react anneal of said metal layer with a pulsed laser, the wavelength of said pulsed laser chosen such that the irradiation will be mostly absorbed by said metal layer, the optical fluence, or laser energy, of said pulsed laser ranging from 0.09 to 0.15 J/cm$^2$ and having a pulse duration ranging from 15 to 30 nanoseconds;

wet etching said wafer to clean away said TiN cap layer and any unreacted metal layer from said polysilicon gate electrodes and silicon source/drain active junctions; and providing a final anneal for changing said high-resistivity C49 phase silicide to a low-resistivity C54 phase silicide using a pulsed laser with an optical fluence ranging from 0.1 to 0.2 J/cm$^2$ converting said metal layer selected from the group of Ti, Co or Ni into titanium silicide, the cobalt silicides (CoSi, CoSi$_2$) or the nickel suicides (NiSi, NiSi$_2$), respectively, ranging in thickness from 300 to 400 Å.

25. The method of claim 24, wherein said react anneal is carried out at an ambient temperature equal to or less than 200° C. in an ambient of nitrogen (N$_2$) or argon (Ar) at a pressure equal to or less than 760 Torr.

26. The method of claim 24, wherein the effective optical fluence of said pulsed laser impinging on said sidewall spacers ranges from 0.01 to 0.05 J/cm$^2$, translating into an interfacial temperature ranging from 700 to 730° C.

27. The method of claim 24, wherein a beam of said pulsed laser is either die-size or ranges in size from 1 to 100 $\mu$m.

28. The method of claim 27, wherein said beam of said pulsed laser is optimized to reduce the intensity variation across the diameter of said laser's beam.

29. The method of claim 24, wherein said pulsed laser is emitting from 1 to 100 pulses at each position of said semiconductor wafer.

30. The method of claim 24, wherein said wet etch comprises an ammonium-based peroxide mixture.

31. The method of claim 24, wherein said pulsed laser is step-scanned across said semiconductor wafer from die to die at a time.

32. The method of claim 24, wherein said pulsed laser is sweep-scanned across said semiconductor wafer.

* * * * *